United States Patent [19]

Salvi et al.

[11] Patent Number: 4,545,824
[45] Date of Patent: Oct. 8, 1985

[54] PROCESS FOR PRODUCING A GAAS OR INP SEMICONDUCTOR BY PRE-IMPLANTATION FOLLOWED BY TRANSITION METAL DIFFUSION

[76] Inventors: Michel Salvi, 90, Chemin de la Pointe Ploumanach, 22700 Perros Guirec; Pierre N. Favennec, Crec3 h Lia, Beg Leguer, Lannion; Marcel Gauneau, Rue du Hingar Huellau á Brèlévenez, both of 22300 Lannion, all of France

[21] Appl. No.: 444,429

[22] Filed: Nov. 24, 1982

[30] Foreign Application Priority Data

Nov. 26, 1981 [FR] France ................. 81 22167

[51] Int. Cl.[4] ............... H01L 21/263; H01L 21/24
[52] U.S. Cl. ........................ 148/1.5; 29/571; 29/576 B; 148/175; 148/187; 357/63; 357/91
[58] Field of Search ............... 148/1.5, 187, 175; 29/571, 576 B; 357/63, 91

[56] References Cited

U.S. PATENT DOCUMENTS

| | | | |
|---|---|---|---|
| 4,017,887 | 4/1977 | Davies et al. | 357/63 |
| 4,240,096 | 12/1980 | Hiraki et al. | 357/63 |
| 4,252,580 | 2/1981 | Messick | 148/175 |
| 4,372,032 | 2/1983 | Collins et al. | 29/571 |
| 4,383,869 | 5/1983 | Liu | 148/1.5 |
| 4,391,651 | 7/1983 | Yoder | 148/1.5 |
| 4,469,528 | 9/1984 | Berth et al. | 148/1.5 |

OTHER PUBLICATIONS

Martin et al., Jour. Appl. Phys. 51 (1980) 2840.
Littlejohn et al., Radiation Effects 10 (1971) 185.

*Primary Examiner*—Upendra Roy
*Attorney, Agent, or Firm*—Pearne, Gordon, Sessions, McCoy, Granger & Tilberry

[57] ABSTRACT

Process for producing a semiconductor component by diffusion with prior ion implantation. According to the invention, an impurity of oxygen, fluorine, chlorine or bromine having chemical affinity with the diffusion impurity is implanted in the semiconductor substrate of GaAs or InP before thermally diffusing Zn, Cd or Fe in the substrate. The diffusion is thus limited in depth.

7 Claims, 2 Drawing Figures

PROCESS FOR PRODUCING A GAAS OR INP SEMICONDUCTOR BY PRE-IMPLANTATION FOLLOWED BY TRANSITION METAL DIFFUSION

BACKGROUND OF THE INVENTION

The present invention relates to a process for producing a semiconductor component by diffusion, with prior ion implantation and also relates to a semiconductor component obtained by this process. It is used in semiconductor technology, in the production of electronic or optoelectronic devices using types III-V semiconductor compounds, such as field effect transistors, bipolar transistors, integrated circuits, detectors, lasers, light emitting diodes, etc.

Type III-V semiconductor compounds are understood to mean semiconductors in the composition of which are used elements of columns III and V of the periodic classification. The term component is understood to cover a device comprising one or more doped or undoped layers.

The semiconductors used in electronic or optoelectronic devices generally comprise layers doped with different types (p and n), which form the junctions. The depth of a junction is an important parameter, which determines the performances of the component. Two processes are generally used for producing such doped layers, namely ion implantation and thermal diffusion.

Generally preference is given to the thermal diffusion process for doping at a relatively great depth with transition metals and for doping at high concentrations. However, this process forces problems in connection with the control of the depth in the case of certain dopant/semiconductor pairs (e.g. zinc in InP). These problems are due to the fact that the diffusion coefficients can be high, even at low temperatures, or that the still inadequately understood problems of abnormal diffusion cause diffusion "tails" extending well beyond the planned depths.

BRIEF SUMMARY OF THE INVENTION

The object of the present invention is to make it possible to control the diffusion depth of an impurity by using a diffused transition metal, in order to obtain a doped layer located at the surface of the substrate and at a clearly defined depth.

This object is achieved by stopping diffusion at a desired depth by limiting the penetration of the diffusing impurity with another impurity placed in the blocking area by ion implantation.

The nature of the penetration limiting impurity is essentially chosen in such a way that it has a high chemical affinity to the transition metal forming the diffusing impurity. It must naturally also be electrically neutral in the material where it is implanted.

According to the invention it is then possible to control the depth and homogeneity of the diffused area, by a careful choice of the nature and energy of the implanted type. Moreover, it becomes possible to eliminate abnormal diffusion tails and obviate the considerable dependence of the diffusion depth on the diffusion time and temperature.

More specifically, the invention relates to a process for producing a semiconductor component in which a substrate formed from type III-V elements is doped by thermal diffusion of a transition metal, wherein, prior to said diffusion, ion implantation takes place in the said substrate of an impurity having chemical affinity for the said metal.

Preferably implantation takes place with an impurity belonging to the group including oxygen, fluorine, chlorine and bromine. Preferably the implantation dose varies between $10^{13}$ and $10^{15}$ ions/cm$^2$.

The present invention also relates to a semiconductor component comprising a type III-V substrate doped with a diffused transition metal, said component being obtained by the process defined hereinbefore and wherein it comprises, in the substrate, a buried area implanted by an impurity having chemical affinity for the said metal.

Preferably the metal in question belongs to the group including zinc, cadmium and iron.

Preferably the implanted area is formed from an impurity belonging to the group comprising oxygen, fluorine, chlorine and bromine.

The semiconductor compound can in particular be GaAs or InP.

The diffusion operation following ion implantation can be carried out by any known means.

The following example illustrates the invention without in any way limiting it.

An implantation of chlorine, fluorine or oxygen (blocking or depth penetration limiting impurity) takes place in an iron-doped, semiinsulating, InP substrate (diffused monocrystalline semiconductor) at a temperature of 580° C. and for 20 minutes. This is followed by a zinc diffusion (diffusing impurity).

For a non-implanted substrate, a diffusion depth of 5.2 $\mu$m is obtained and the diffusion profile has a diffusion tail.

In the case of a substrate implanted in the indicated way, the depth of the diffusion is reduced to:

1.2 $\mu$m with chlorine implanted at 1.6 MeV;
2.2 $\mu$m with fluorine implanted at 1.2 MeV;
2.7 $\mu$m with oxygen implanted at 1 MeV.

Thus, the diffusion depth is defined by the implantation conditions (nature of the implanted impurity and energy) doped layers having a very limited thickness can be obtained by reducing the implantation energy. Generally this energy is between 0.5 and 2 MeV.

The process described hereinbefore can be used with any electronic or optoelectronic device requiring one or more doped layers in ternary quaternary or other GaAs or InP semiconductors. It is also applicable to already prepared structures and which have e.g. undergone epitaxy (homoepitaxy or heteroepitaxy).

BRIEF DESCRIPTION OF THE DRAWINGS

The characteristics of the components obtained by the process of the invention will become more apparent from the following description of an exemplified embodiment, with reference to the attached drawings, wherein show.

DETAILED DESCRIPTION OF THE PREFERRED EMBODIMENTS

Figure 1:
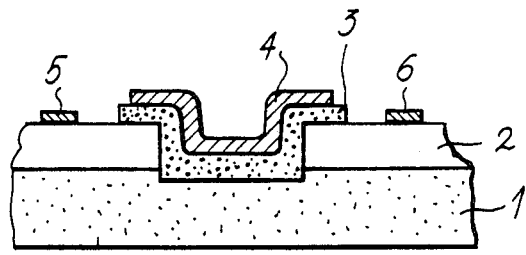
FIG. 1 is a transverse cross-section of a prior art MISFET transistor.
Figure 2:
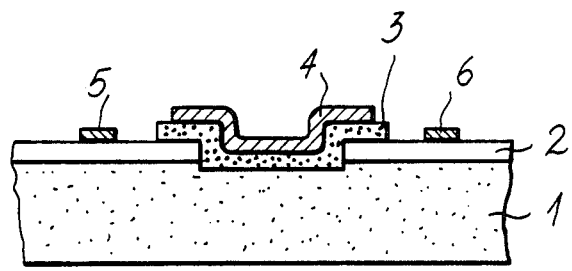
FIG. 2 is a transverse cross-section of a transistor of the same type obtained according to the process of the invention.

In FIGS. 1 and 2, the transistor shown is of the channel p enrichment type. It comprises an iron-doped, semiinsulating InP substrate 1, a diffused type p$^+$ area 2, an insulating layer 3, a gate metallization 4, a source metallization 5 and a drain metallization 6.

The two diagrams reveal a considerable difference between the two cases. Without limiting the penetration depth of the implanted impurity (FIG. 1), the sample must be deeply hollowed out, e.g., by etching, (to more than 5 μm) to enable the insulant 3 to be deposited on the semiinsulating substrate. In the case where, according to the invention, limiting of the penetration depth of the diffusing impurity has been carried out by an implantation of chlorine, the sample is much less deeply hollowed out, a thickness of 0.5 μm being sufficient.

The different stages of the production process for such a transistor can be as follows:

preparation of the substrates,
chlorine implantation: 500 KeV, $10^{14}$ ions/cm$^2$,
diffusion of Zn, 580° C., 20 minutes,
deposition of the insulant,
deposition of the source, gate and drain metallizations.

The process then continues as in the conventional case.

What is claimed is:

1. A process for producing a semiconductor component comprising the steps of:
   providing a semiinsulating substrate belonging to the group including GaAs and InP;
   implanting said substrate with ions of an impurity belonging to the group including oxygen, fluorine, chlorine, and bromine; and
   thermally diffusing a metal in the thus implanted substrate, said metal belonging to the group including zinc, cadmium and iron.

2. A process according to claim 1, wherein the ions implanting operation is carried out with an energy between 0.5 and 2 MeV.

3. A process according to claim 1, wherein the ions implanting operation is carried out with a dosage between $10^{13}$ and $10^{15}$ ions/cm$^2$.

4. A process according to claim 1, wherein the implanting operation is of an ion having a chemical affinity for the metal diffused in the thermal diffusion step.

5. A process for producing a semiconductor component comprising the steps of:
   providing a semiinsulating substrate of InP;
   implanting said substrate with chlorine ions; and
   thermally diffusing zinc in the thus implanted substrate.

6. A process according to claim 4, wherein the ions implanting operation is carried out with an energy between 0.5 and 2 MeV.

7. A process according to claim 4, wherein the ions implanting operation is carried out with a dosage between $10^{13}$ and $10^{15}$ ions/cm$^2$.

* * * * *